(12) United States Patent
Carlson et al.

(10) Patent No.: US 9,587,324 B2
(45) Date of Patent: Mar. 7, 2017

(54) APPARATUS FOR PROCESSING A MELT

(71) Applicant: Varian Semiconductor Equipment Associates, Inc., Gloucester, MA (US)

(72) Inventors: Frederick M. Carlson, Potsdam, NY (US); Peter L. Kellerman, Essex, MA (US); David Morrell, Wakefield, MA (US); Brian Mackintosh, Concord, MA (US); Nandish Desai, Waltham, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 354 days.

(21) Appl. No.: 14/275,770

(22) Filed: May 12, 2014

(65) Prior Publication Data
US 2015/0322590 A1    Nov. 12, 2015

(51) Int. Cl.
| | |
|---|---|
| *C30B 11/14* | (2006.01) |
| *C30B 15/06* | (2006.01) |
| *F27B 14/06* | (2006.01) |
| *F27B 14/14* | (2006.01) |
| *C30B 15/10* | (2006.01) |
| *C30B 15/14* | (2006.01) |
| *C30B 29/06* | (2006.01) |
| *C30B 29/64* | (2006.01) |
| *F27B 3/02* | (2006.01) |
| *F27B 3/10* | (2006.01) |
| *F27D 99/00* | (2010.01) |

(52) U.S. Cl.
CPC .............. *C30B 15/06* (2013.01); *C30B 15/10* (2013.01); *C30B 15/14* (2013.01); *C30B 29/06* (2013.01); *C30B 29/64* (2013.01); *F27B 3/02* (2013.01); *F27B 3/10* (2013.01); *F27B 14/06* (2013.01); *F27B 14/14* (2013.01); *F27D 2099/0013* (2013.01); *Y10T 117/1048* (2015.01)

(58) Field of Classification Search
CPC .......... C30B 11/00; C30B 11/14; C30B 35/00
See application file for complete search history.

(56) References Cited

U.S. PATENT DOCUMENTS

| | | |
|---|---|---|
| 4,264,407 A | 4/1981 | Shudo et al. |
| 4,289,571 A | 9/1981 | Jewett |
| 5,047,113 A | 9/1991 | Ostrogorsky |
| 5,174,801 A | 12/1992 | Matsumura et al. |
| 6,849,121 B1 | 2/2005 | Iseler et al. |
| 2011/0000424 A1 | 1/2011 | Duffar et al. |
| 2013/0112135 A1 | 5/2013 | Carlson et al. |

OTHER PUBLICATIONS

Search Report and Written Opinion mailed Jul. 31, 2015 in corresponding International Patent Application No. PCT/US2015/030319.

(Continued)

*Primary Examiner* — Robert M Kunemund

(57) ABSTRACT

An apparatus for processing a melt may include a crucible configured to contain the melt, where the melt has an exposed surface that is separated from a floor of the crucible by a first distance. The apparatus may further include a submerged heater comprising a heating element and a shell disposed between the heating element and the melt, wherein the heating element does not contact the melt. The heating element may be disposed at a second distance with respect to the exposed surface of the melt that is less than the first distance.

19 Claims, 9 Drawing Sheets

(56) References Cited

OTHER PUBLICATIONS

Kellerman, Peter L., et al., Apparatus far Controlling Heat Flow Within A Silicon Melt, U.S. Appl. No. 14/227,006, filed Mar. 27, 2014.

Kudo, B., Improvements in the Horizontal Ribbon Growth Technique for Single Crystal Silicon, Journal of Crystal Growth 50, 1980, pp. 247-259, North Holland Publishing Company, Netherlands.

APPARATUS FOR PROCESSING A MELT

FIELD

The present embodiments relate to growth of crystalline material from a melt and more particularly to forming a single crystalline sheet from a melt.

BACKGROUND

Silicon wafers or sheets may be used in, for example, the integrated circuit or solar cell industry. Demand for solar cells continues to increase as the demand for renewable energy sources increases. One major cost in the solar cell industry is the wafer or sheet used to make solar cells. Reductions in cost to the wafers or sheets may reduce the cost of solar cells and make this renewable energy technology more prevalent. One promising method that has been investigated to lower the cost of materials for solar cells is the horizontal ribbon growth (HRG) technique where crystalline sheets are pulled horizontally along the surface of a melt. In this method, a portion of a melt surface is cooled sufficiently to locally initiate crystallization with the aid of a seed, which may be then drawn along the melt surface to form a crystalline sheet. The local cooling may be accomplished by providing a device that rapidly removes heat above the region of the melt surface where crystallization is initiated. Under proper conditions a stable leading edge of the crystalline sheet may be established in this region.

In order to ensure growth stability, it may be useful to control heat flow through the melt in the region of the leading edge of the crystalline sheet that is drawn from the melt. However, achieving controlled heat flow within a silicon melt is very challenging for several reasons. Firstly, molten Si has a very high thermal conductivity, so that any heat introduced at the bottom of a crucible that contains the melt spreads out before reaching the melt surface. In addition, fused silica is often used as the crucible material used to contain silicon melt, due to its resistance to reaction with silicon at elevated temperature. However, fused silica is a good thermal insulator which generates a large thermal gradient when substantial heat flow is conducted from outside the crucible into the silicon melt. In turn, this that the outer temperature of the fused silica crucible being heated is maintained at a much higher temperature than the melt temperature. Additionally, a temperature drop is incurred when heat flows from a bottom of a crucible to the surface of a melt, which is proportional to the melt depth of the melt within a crucible. In the case of horizontal growth of crystalline sheets from a silicon melt a melt thickness in the range of 10-15 mm is commonly employed to achieve stable processing conditions. However, fused silica softens to an unacceptable degree above 1880 K, which limits the amount of heat flow that can be introduced by a heat source into the bottom of a crucible while still maintaining a needed melt temperature at the surface of the melt. This limited heat flow provided by present day apparatus may not be sufficient to ensure desired quality of a crystalline sheet grown from the melt surface.

It is with respect to these and other considerations that the present improvements have been needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment, an apparatus for processing a melt may include a crucible configured to contain the melt, where the melt has an exposed surface that is separated from a floor of the crucible by a first distance. The apparatus may further include a submerged heater comprising a heating element and a shell disposed between the heating element and the melt, wherein the heating element does not contact the melt. The heating element may be disposed at a second distance with respect to the exposed surface of the melt that is less than the first distance.

In a further embodiment, a system for controlling heat flow within a melt may include a crucible configured to contain the melt, where the melt has an exposed surface that is separated from a floor of the crucible by a first distance. The system may further include a submerged heater configured to contact the melt. The submerged heater may include a heating element and a shell that is disposed between the heating element and the melt, wherein the melt does not contact the heating element. The heating element may be disposed at a second distance with respect to the melt that is less than the first distance, wherein the submerged heater is configured to deliver heat to a region of the exposed surface at a first heat flow rate. The system may also include a crystallizer configured to remove heat from the region of the exposed surface at a second heat flow rate greater than the first heat flow rate.

In another embodiment, a method to process a melt may include arranging the melt in a crucible; the melt having an exposed surface and lower surface that is in contact with a floor of the crucible, the exposed surface being separated from the lower surface by a first distance; and directing a heat flow from a heating element of a submerged heater into a region of the exposed surface of the melt when the heating element is disposed at a second distance from the exposed surface that is less than the first distance, wherein the melt does not contact the heating element.

DETAILED DESCRIPTION

Figure 1A:
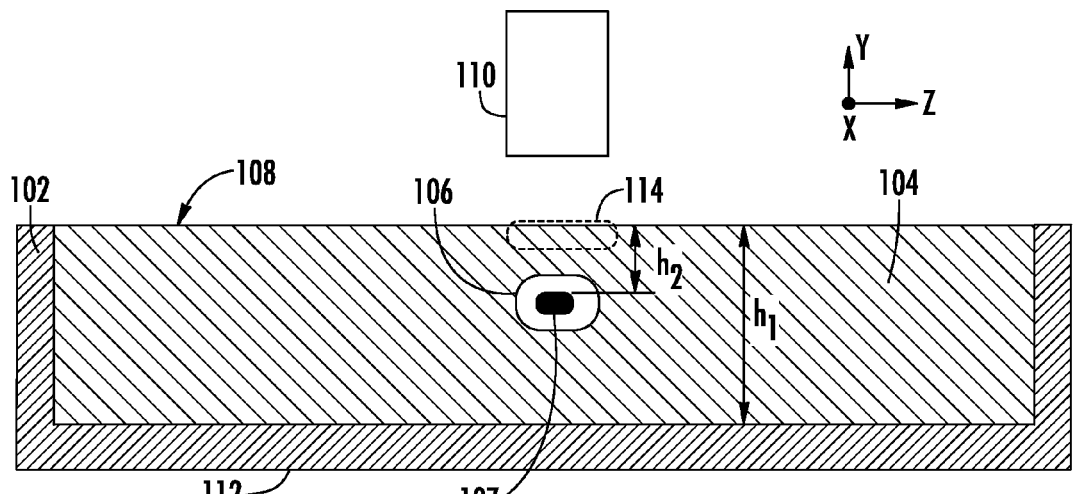
FIG. 1A depicts a cross-sectional view of a processing apparatus for processing a melt consistent with the present embodiments.

The present embodiments provide apparatus to control heat flow within a melt such as a silicon melt. Various embodiments provide an apparatus for processing a melt that includes a crucible configured to contain the melt, where the melt has an exposed surface. In embodiments for processing silicon melts, the crucible may be composed of fused silica. As with conventional apparatus, a conventional heater that acts as a crucible heater may be disposed below at least some portions of a floor of the crucible that is opposite the exposed surface. Such a crucible heater may be used in order to supply heat that flows through the crucible into the melt to maintain the melt at least at its melting temperature. Unlike conventional apparatus, an additional heater is additionally provided that is termed a "submerged heater" herein, which may be used to provide concentrated heat flow at a target region of the exposed surface of the melt. This submerged heater may be used in conjunction with a crystallizer that removes heat from the target region in order to generate a stable growth front of a crystalline sheet of silicon from which horizontal ribbon growth takes place.

As detailed below an advantage provided by the present embodiments is that a submerged heater may generate a heat flow density at an exposed surface of a melt in excess of 30 W/cm$^2$, and in some cases in excess of 50 W/cm,$^2$ which levels are not accomplished by use of conventional apparatus. The present inventors have recognized that, counter-intuitively, such high levels of heat flow density for heat flowing into an exposed surface of a melt may be useful to stabilize growth of crystalline sheets in horizontal growth apparatus such as those disclosed herein. In other words, although growth of a crystalline sheet from a surface of a melt entails reducing the temperature locally where crystallization is to take place at a leading edge, to achieve higher quality crystalline sheets it may nevertheless be desirable to increase the rate of heat flow into the region of the leading edge in comparison to the heat flow supplied by conventional melt growth apparatus. Of course this increased heat flow into the region of the leading edge may be balanced by an increased removal of heat from the exposed surface of the melt in the same region where the leading edge forms so that crystallization may take place.

In the present embodiments a submerged heater may be located closer to the exposed surface of the melt than in apparatus heated by a conventional heater or heaters, which heaters are used to heat the melt from outside a floor of the crucible. In particular, regardless of the exact configuration of the submerged heater, the submerged heater may include a heating component also referred to herein as a heating element that is disposed closer to the exposed surface of the melt than is the floor of the crucible. The submerged heater of the present embodiments may include a shell that is disposed between the heating element and the melt, such that the melt does not contact the heating element. The shell may be composed of an inert material such as fused silica. In this manner, the heating element can be placed close to the exposed surface of the melt where horizontal growth of a crystalline sheet is to be initiated, without exposing the heating element to the potentially corrosive or reactive melt.

FIG. 1A depicts a cross-sectional view of an apparatus for processing a melt consistent with the present embodiments. The processing apparatus 100 includes a crucible 102 that contains a melt 104 having an exposed surface 108 where horizontal growth of a crystalline sheet may take place. The crucible 102 has a floor 112 that is opposite the exposed surface 108. Heat may be provided to the melt 104 by a conventional heater or heaters (not shown) disposed outside the crucible 102 proximate the floor 112. This heat may be used to maintain the melt 104 at or above its melting temperature. In this embodiment and other embodiments, a submerged heater, shown as submerged heater 106, is also provided to generate additional heating to the melt 104. The submerged heater 106 includes a heating element 107 that may provide a high heat flow to a region 114 of the exposed surface 108. The region 114 may include portions of the melt 104 just below the exposed surface 108 such as one to three millimeters below the exposed surface 108.

When a sufficiently high heat flow is provided into the region 114, stable growth of a crystalline sheet may take place, such as a crystalline sheet of silicon. In particular, it has been recognized by the present inventors that the nature of the facet formed at a leading edge of a horizontally grown silicon sheet having a [100] orientation within the plane of the silicon sheet may be better stabilized by providing a high heat flow into the leading edge. In particular, a (111) facet may form at the leading edge, which may form an angle of 54.7 degrees with respect to an exposed surface of a melt. This high angle facet may be better stabilized by providing heat flow in excess of that provided by conventional apparatus in which external heaters are used to heat a crucible.

In the present embodiments, and as shown in FIG. 1A, at least a heating element of the submerged heater 106 is disposed closer to the exposed surface 108 of the melt 104 than the floor 112 of the crucible 102. As illustrated in FIG. 1A, the floor 112 is separated by a distance $h_1$ from the exposed surface 108 along a direction parallel to the Y-axis in the Cartesian coordinate system shown, while the top of the heating element 107 of the submerged heater 106 is disposed at a distance $h_2$ from the exposed surface 108 along the same direction, which distance represents a submerged depth of the heating element. In this embodiment and other embodiments to follow, the distance of a top or top surface of a heating element with respect to an exposed surface of a melt may be referred to as the distance of a heating element with respect to the exposed surface. However, it will be understood unless otherwise noted that the distance of a heating element from a top surface refers to the distance of the nearest portion of the heating element to the exposed surface, which may be referred to as the "top" of the heating element. In this and other embodiments, this distance $h_2$ is smaller than the distance $h_1$ and allows the submerged heater 106 to generate heat closer to the region 114 than is generated by a conventional heater that is disposed below the floor 112. Because of this, a higher heat flow may be generated to the region 114 by the submerged heater 106 than by conventional heaters. In addition, the higher heat flow may be generated in a more selective manner so that regions outside the region 114 experience lower heat flow. This may be desirable since at other regions such as below a growing crystalline sheet (not shown), excessive heat flow may result in unwanted melt back of the growing crystalline sheet.

It is to be noted that the amount of heat deliverable to an exposed surface of a melt using conventional heaters may not be limited by the heat flow that can be generated by a heating element, but rather by the properties of materials used in conventional crystal growth apparatus. For example, fused silica is used as a crucible material for molten silicon because it does not react with molten silicon and does not provide a source of contaminant materials to a crystalline sheet grown from such a melt. However, because of its low thermal conductivity a large thermal gradient develops between a heat source external to a fused silica crucible and a silicon melt within the crucible. In order to stabilize a leading edge of a silicon crystalline sheet, it may be desirable to generate a heat flow of 20 W/cm$^2$ or higher to the exposed surface of a melt where the leading edge may form. This degree of heat flow may be easily generated at a heat source such as a conventional, external heater that acts as a crucible heater used to heat a fused silica crucible. However, when heat flow in the range of 20 W/cm$^2$ is applied across a fused silica crucible, whose thermal resistivity may be 0.05 W/cm-K, a thermal gradient of 400 K/cm develops across the thickness of the crucible. For an acceptable crucible thickness of 4 mm, this results in a temperature drop of 160 K across the crucible, which the temperature on the heated side of the crucible to be at least 160 K higher than the melting temperature of silicon, or about 1845 K. Additionally, due to the thermal resistivity of the silicon melt itself an additional temperature drop in the range of 30 K to 50 K may take place between the bottom of the melt adjacent the external heater and the exposed surface where crystallization is to take place. This therefore entails supplying a temperature on the external side of a fused silica crucible in the range of 1875 K to 1895 K for the example fused silica thickness discussed above. However, fused silica may soften to an unacceptable degree above 1880 K. Thus, it may not be feasible to supply heat flow in excess of 20 W/cm$^2$ using conventional apparatus. While a silicon melt may be maintained in a molten state using a lower heat flow into the melt, this level of heat flow may not be sufficient to produce a high quality crystalline sheet of silicon because heat flow into the leading edge is too low.

The present embodiments address this problem in multiple ways. For one, by providing submerged heaters where the heating element of a submerged heater may be placed much closer to the exposed surface less dissipation of heat takes place between the heat source and exposed surface of a melt where growth of a crystalline sheet is to take place. This reduces the drop in temperature between heat source (heating element) and the exposed surface of a melt, as well as the decrease in heat flow per unit area that is deliverable to the leading edge of a crystalline sheet. In addition, in various embodiments the dimension of the heat source including a heating element along the Z-axis is small in comparison to the melt depth such as 1 mm to a few millimeters in size along the Z-direction. Thus, increased heat flow may be provided locally primarily into a target region, such as region 114, whose target length along the Z-direction may be on the order of 1 mm to 2 mm. Finally, because the submerged heaters may be relatively small and have relatively low mass as discussed below, the thickness of a fused silica shell to protect the submerged heater may be much less than in conventional crucibles, as discussed below. As detailed with respect to FIGS. 2A-2C, this feature allows higher heat flow to be generated for a given temperature drop from heater to melt, thus providing a greater heat flow without endangering the mechanical integrity of the fused silica.

For various reasons, this ability to deliver increased heat flow at the exposed surface 108 and to concentrate the heat flow in a region 114 may not be accomplished by conventional apparatus. For example, a depth of the melt 104 from a lower surface to the exposed surface 108, which is equivalent to $h_1$, may range between 10 and 20 mm. Thus, any heat generated below the floor 112 may travel a distance in the range of 10-20 mm before reaching the exposed surface 108 in the region 114. It may therefore be difficult to provide concentrated heat flow to the region 114 because of the high thermal conductivity of silicon, which may dissipate the heat flow in a lateral direction parallel to the X-Z plane before the heat reaches the exposed surface 108.

In various embodiments, a heating element 107 of a submerged heater 106 may be disposed at a distance within one to three millimeters from the exposed surface 108, which is equivalent to $h_2$ shown in FIG. 1A. In some embodiments as detailed further below a submerged heater may be configured to move so as to vary the distance $h_2$ which may allow the amount of heat flow as well as the profile of heat flow delivered to the exposed surface to be varied.

Figure 1B:
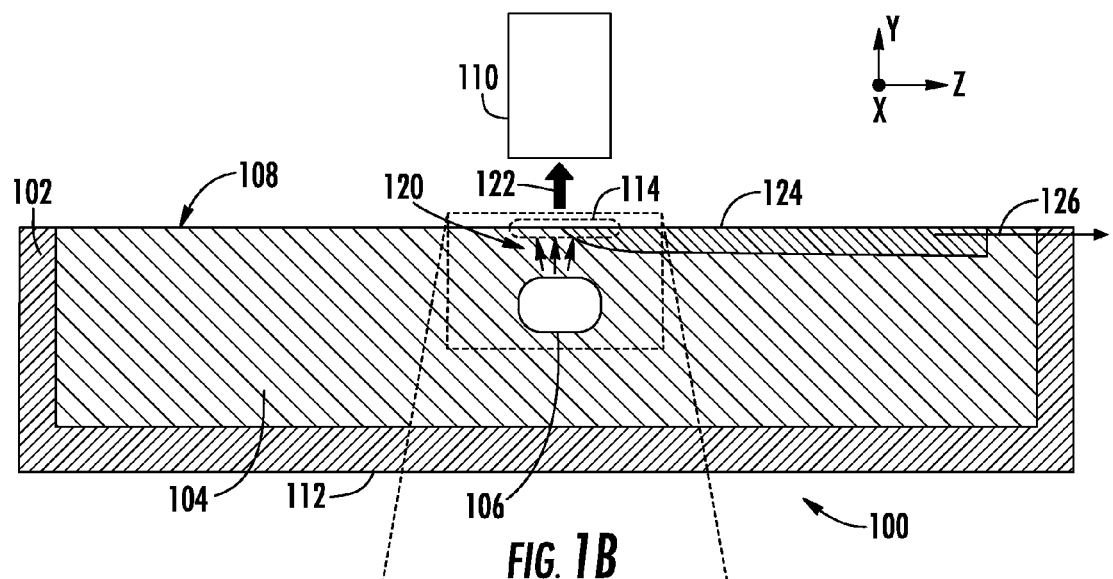
FIG. 1B depicts one instance of operation of the processing apparatus of FIG. 1A.
Figure 1C:
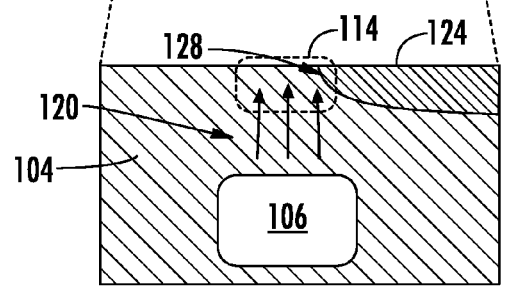
FIG. 1C depicts a close-up of the operation shown in FIG. 1B.

FIG. 1B depicts one instance of operation of the processing apparatus 100. In this example, the submerged heater 106 is engaged to generate heat flow 120 that is concentrated in the region 114. At the same time a crystallizer 110 is provided above the exposed surface 108 to provide cooling that removes heat from the exposed surface, which is shown as heat flow 122. In various embodiments the crystallizer 110 may be a cold block that is maintained at a temperature lower than the melt temperature of the melt 104. Heat flow may be conducted from the surface to the crystallizer 110. In one example, the crystallizer 110 may provide a gas jet of helium gas that is cooler than the melt temperature of the melt 104, which facilitates heat removal from the exposed surface 108. In some examples, this may result in heat removal that generates a heat flow in excess of 100 W/cm$^2$ from the exposed surface 108 outwardly towards the crystallizer 110. This rate of heat removal may be effective to locally cool the exposed surface so that a high quality crystalline sheet of silicon may be drawn from a region along the exposed surface 108. For example, when a crystal puller (not shown) moves along a direction 126 parallel to the Z-axis, a crystalline sheet 124 may be drawn from the melt 104 as shown. At the same time the heat flow 120 may exceed 50 W/cm$^2$ in the region 114, which may be 0.5 mm to 3 mm wide in different examples. However, the embodiments are not limited in this context. This high value for heat flow 120 into the region 114 may help stabilize the leading edge 128, as illustrated in a close-up view of FIG. 1C.

Figure 1D:
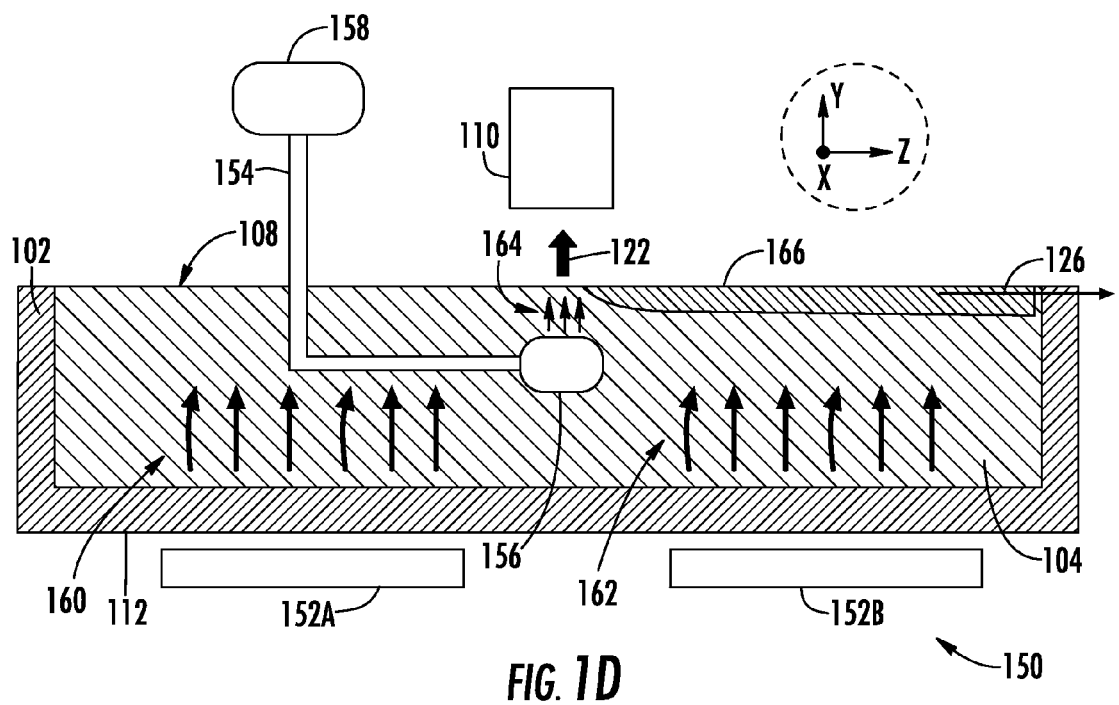
FIG. 1D is a cross-sectional view of a variant of the processing apparatus of FIG. 1A.

As noted, in order to tailor the heat flow into the region 114, some embodiments provide a movable submerged heater in which the position of the submerged heater is adjustable with respect to the exposed surface 108 of a melt 104. FIG. 1D depicts one variant of a processing apparatus 150 in which the submerged heater 156 is movable at least in one direction with respect to the exposed surface 108. In some embodiments, a drive 158 is coupled to a holder 154 that in turn is coupled to the submerged heater 156. The drive 158 may be configured to move the submerged heater 156 along the X-axis, Y-axis, and Z-axis in some embodiments. In particular embodiments, for example, the drive 158 may be configured to move the submerged heater 156 along a vertical direction, that is, parallel to the Y-axis and perpendicular to the exposed surface 108, which may lie parallel to the X-Y plane. External heaters are provided to heat the melt 104 to maintain the melt 104 above its melting temperature. In operation, an external heater such as the heater 152A may generate heat flow 160 while another external heater such as heater 152B generates heat flow 162. At the same time, crystallizer 110 provides cooling to generated the heat flow 122 outwardly from a portion of the exposed surface 108, which facilitates formation of a crystalline sheet 166 as described above. In one instance the heater 152B, which is disposed under the crystalline sheet 166, generates a heat flow 162 that is less than the heat flow 160, which may maintain regions of the melt 104 adjacent the floor 112 of crucible 102 in molten form without melting the crystalline sheet 166 that forms in the region of the exposed surface 108. Additionally, the submerged heater 156 generates a surface heat flow 164, which may be greater than heat flow 160 and heat flow 162. The term "surface heat flow" refers to a heat flow per unit area, such as W/cm$^2$, at the exposed surface 108. Thus, because the submerged heater may be positioned at a desired distance with respect to the exposed surface 108, where $h_2$ is one millimeter to three millimeters, for example, the surface heat flow 164 may exceed 50 W/cm$^2$ in some instances, which aids in stabilizing the leading edge of the crystalline sheet 166.

Figure 2A:
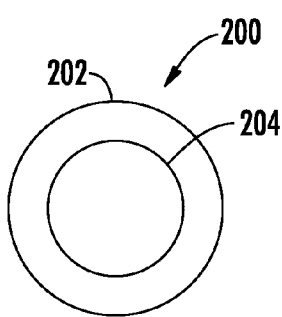
FIGS. 2A-2C depict respective side views of alternative embodiments of submerged heaters.
Figure 2B:
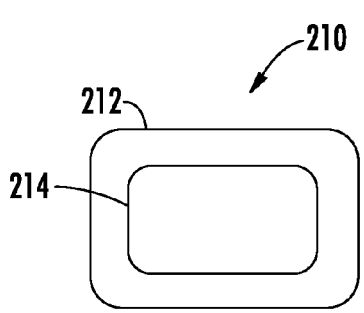
Figure 2C:
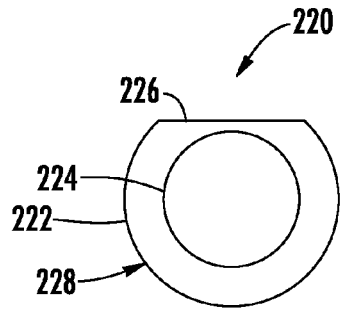

In various embodiments, a submerged heater may have different shapes. The submerged heater may have a circular cross-section, a rectangular cross-section, or other shape. The embodiments are not limited in this context. In embodiments for processing a silicon melt, the submerged heater may have an outer surface composed of fused silica. FIGS. 2A to 2C present a side cross-sectional view of alternative embodiments of submerged heaters. FIG. 2A depicts a submerged heater 200 having a circular cross-section in which a heating element 204 is enclosed by a shell 202, which may be composed of fused silica. The heating element 204 and other heating elements disclosed herein may be a resistive heating element in some implementations, including a graphite heating element or other resistive heating element as known in the art. An exemplary diameter of the submerged heater 200 may be 2 mm to 1 cm, although the embodiments are not limited in this context. FIG. 2B provides another submerged heater 210 having a heating element 214 encased by a shell 212. As with the submerged heater 200, the submerged heater 210 may have a graphite material as heating element 214 and the shell 212 may be composed of fused silica. The cross-sectional dimensions of submerged heater 210 may be similar to those of submerged heater 200, but the cross-section may give a rectangular shape as illustrated.

In particular embodiments a heating element such as the heating element 214 may be composed of graphite that is coated with silicon carbide (SiC) in order to provide a more robust heating element. The present inventors have found that operation of an uncoated graphite heating element at elevated temperature may cause reaction with a fused silica shell that causes formation of crystobalite crystalline material from the fused silica shell, which may lead to deterioration in performance of the shell and heater. Accordingly a layer of SiC may be provided between the graphite and fused silica shell to prevent formation of crystobalite and increase lifetime of the heating element.

FIG. 2C presents a further embodiment of a submerged heater 220, which has a generally circular cross-section in which a shell 222 surrounds a heating element 224, except that a thinned portion 226 is formed in a region in which the outer surface 228 is flat rather than circular. This embodiment provides the advantage that a higher heat flow external to the submerged heater 220 may be generated into regions adjacent the thinned portion 226 as detailed below with respect to additional embodiments.

In one implementation in all the embodiments of FIGS. 2A to 2C, the thickness of a shell of a given submerged heater may be less than the thickness of the wall of a conventional fused silica crucible that receives heat from an external heater. As noted above, the thickness of a fused silica crucible may be 4 mm, which may be a minimum thickness needed in order to supply mechanical integrity to the crucible, especially when operating at temperatures that are at or above the silicon melt temperature 1685 K. In contrast, due to the small loads that may be placed on the submerged heaters of the embodiments of FIGS. 2A-2C the thickness of a submerged heater shell, which may also be composed of fused silica, may be in the range of 1 mm. This greatly reduces the temperature drop from the side of the fused silica in contact with a heating element and the side in contact with the silicon melt. For example, assuming the same thermal properties as discussed above for fused silica, to supply 20 W/cm$^2$ across a 1 mm thick fused silica shell, the temperature drop is 40 K. Assuming the melt temperature on the outer surface of a submerged heater is at a minimum 1685 K, this merely sets the temperature on the inner surface of the fused silica shell at 1725 K, well below the temperature of unacceptable softening. Moreover, in other cases, the submerged heater may be set to generate a heat flow of 80 W/cm$^2$ without unacceptable softening of the submerged heater shell, since this latter heat flow would generate a temperature drop of 160 K across a 1 mm thick fused silica shell. In this case, the inner surface of the fused silica shell would be subject to a temperature of at least 1845 K (1685+160), still within an acceptable temperature range within which unacceptable softening of the fused silica does not occur. Moreover, because the submerged heaters may be located much closer to an exposed surface of the melt, a majority of the heat flow generated by the submerged heater may be delivered to the exposed surface.

Figure 3A:
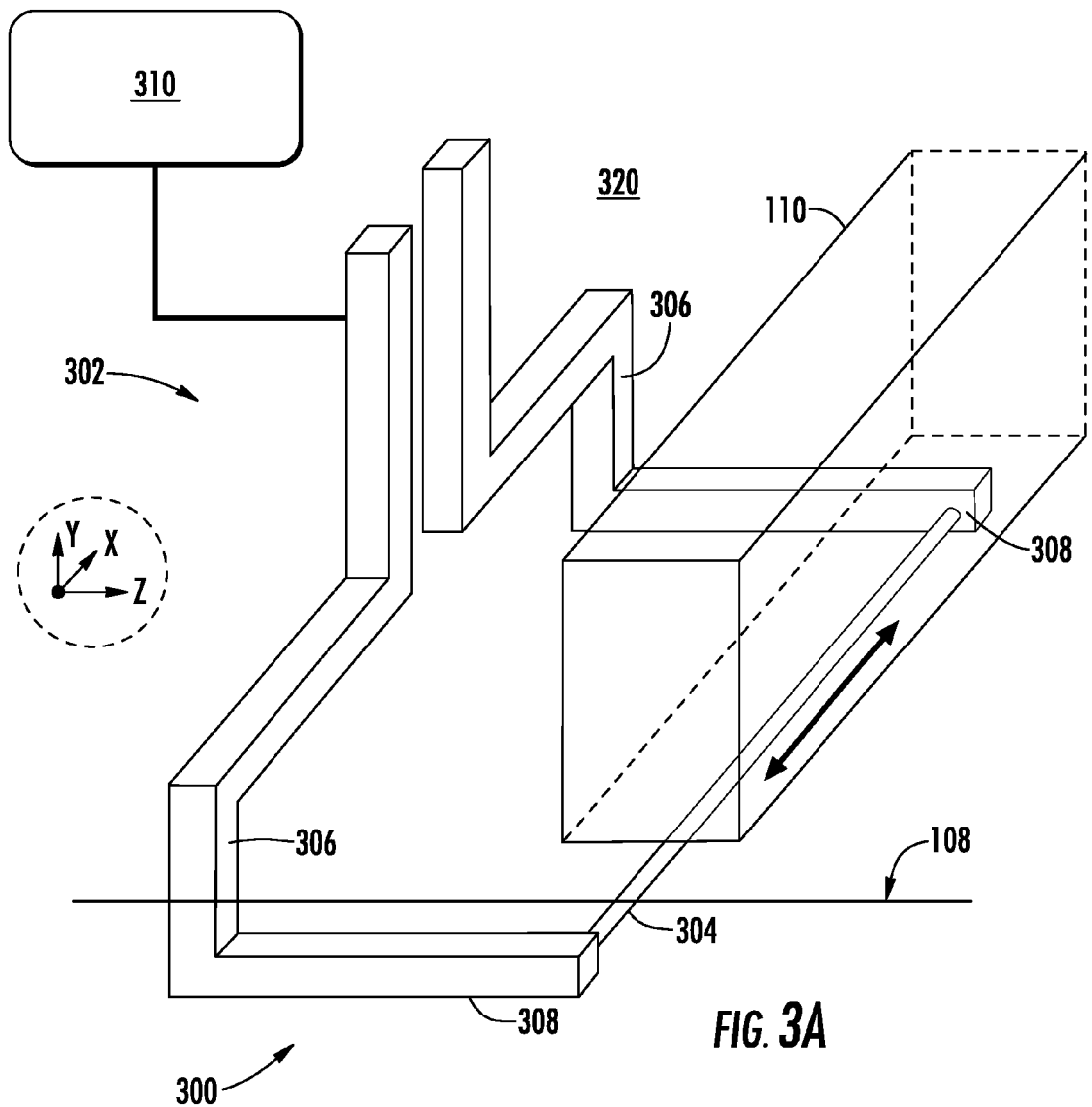
FIG. 3A depicts a top perspective view of another embodiment of a submerged heater.

FIG. 3A depicts a top perspective view one embodiment of a submerged heater 300. FIG. 3A depicts the submerged heater 300 within in a processing apparatus 320, showing portions of the processing apparatus 320 with some components omitted for clarity. The submerged heater 300 includes a holder portion 302 that is coupled to a heater portion 304. The holder portion may include a post portion 306 and arm portion 308 as shown. As used herein, the term "heater portion" refers to a heating element as well as a structure or shell that surrounds or encases the heating element. The term "heating element" as used herein refers to an active component that generates heat, such as a resistive or inductive heater, and may additionally refer to a thermally conductive element that conducts the heat from the active element to the shell of the submerged heater. Thus, in one example, a heating element may include a resistive heater component that is heated by passing current through the heater component as well as a graphite component that conducts the heat from the resistive heater component but itself is not resistively heated. Of course the resistive heater component may be composed of graphite itself. Embodiments disclosing different aspects of these variants are described hereinbelow.

As shown in FIG. 3A, the holder portion 302 may also be coupled to a drive 310, which may move the holder portion with respect to the crystallizer 110 and exposed surface 108 along the X-direction, Y-axis, and Z-axis. This facilitates positioning the heater portion 304 at a desired location with respect to the crystallizer 110, for example. As illustrated the heater portion 304 is elongated in the X-axis. In this example the heater portion 304 has the shape of a rod and may include a rod-shaped heating element within the heater portion 304. The holder portion 302 and heater portion 304 may both be composed of graphite or other material suitable for use as a resistive heater. Both the holder portion 302 and heater portion 304 may include an outer structure composed of fused silica as discussed below.

Figure 3B:
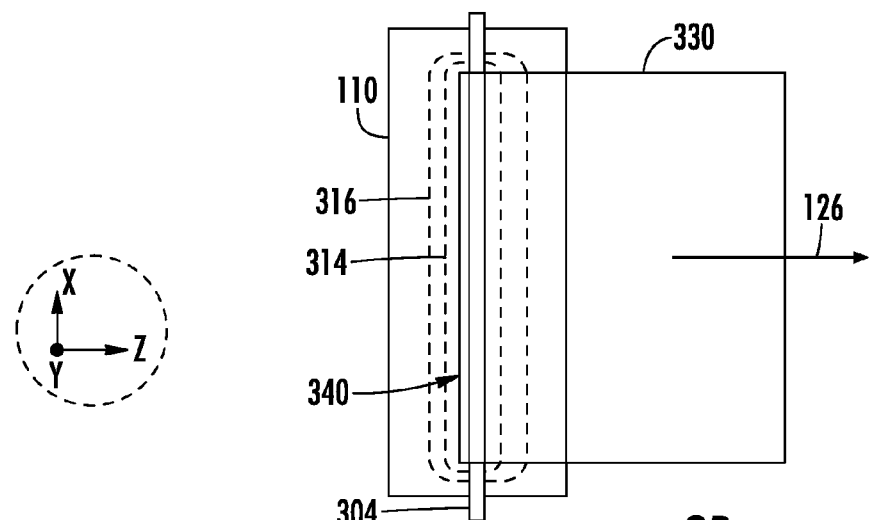
FIG. 3B depicts a top plan view of the submerged heater of FIG. 3A.

In operation the heater portion may provide localized heating to a heating zone that is elongated along a surface region of the exposed surface 108. FIG. 3B depicts a top plan view of the heater portion 304 and crystallizer 110, which illustrate a heating zone 314 that may be generated by the heater portion 304 at the exposed surface 108. As illustrated, the heating zone 314 is elongated along the X-axis and may have a width that is the same or similar to the heater width of the heater portion 304 along the X-axis. As also shown in FIG. 3B, the crystallizer 110 may generate a cooling zone 316 that generates a region where crystallization of a crystalline sheet 330 takes. The cooling zone 316 may also be elongated along the X-axis. The crystalline sheet 330 may be drawn by pulling in a direction perpendicular to the X-axis, that is, direction 126. The crystallizer 110 may be configured to form a leading edge 340 of the crystalline sheet 330 along the X-axis when pulling takes place along the direction 126. The heating zone 314 may overlap the cooling zone 316. The heating zone 314 may provide sufficient heat to stabilize the leading edge 340. In various embodiments, the width of the heating zone 314, which may be similar to or the same as the width of the cooling zone 316, may range between 150 mm or 200 mm or 300 mm, in order to produce crystalline sheets of the same respective widths.

Figure 4A:
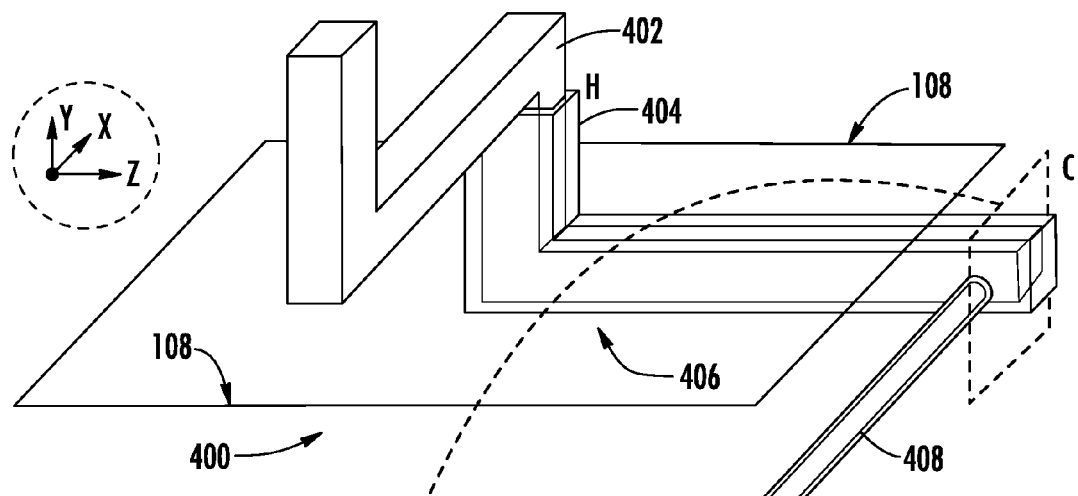
FIG. 4A depicts a top perspective view of a further embodiment of a submerged heater.

FIG. 4A depicts details of a variant of the submerged heater 300. In this variant, a portion of a submerged heater 400 is shown including one side of a holder 406 and heater portion 408. The holder 406 includes an inner structure 402 and a shell 404, which surrounds the inner structure 402. The inner structure 402 may be graphite or other electrically conductive material. The shell 404 may be composed of fused silica and may encase the inner structure 402 along at least to a height H that is designed to be above an exposed surface 108 of a melt during operation. The heater portion 408 may also be composed of graphite of other electrically conductive material that is encased in fused silica.

Figure 4B:
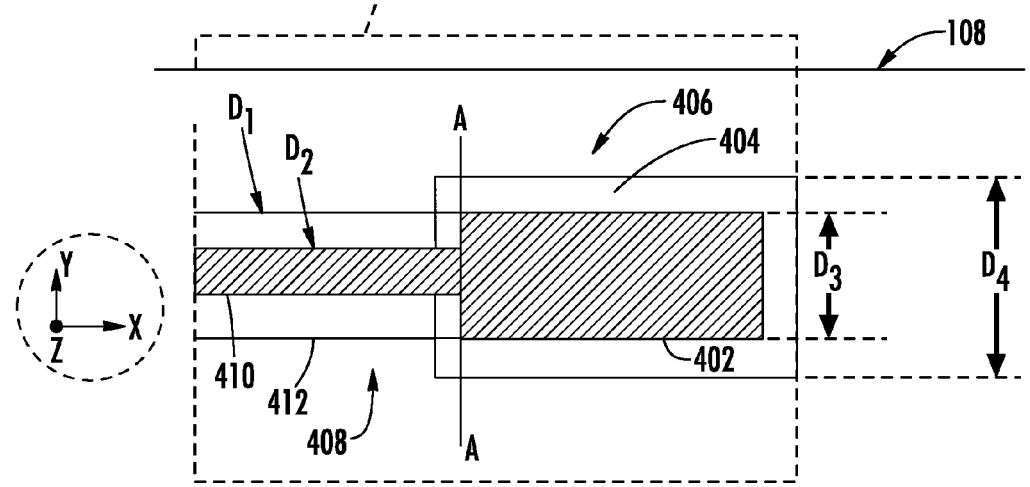
FIG. 4B depicts an end cross-sectional view of the submerged heater of FIG. 4A.

FIG. 4B depicts an end view of a portion of the submerged heater 400 showing the area C of FIG. 4A. As illustrated the heater portion 408 is composed of a shell 412 that encases a heating element 410. The heating element 410 may be mechanically affixed to the inner structure 402 or may be integrally formed from the same material as inner structure 402. In this manner the heating element 410 may be electrically coupled to the inner structure 402.

Figure 4C:
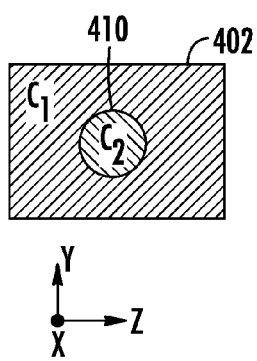
FIG. 4C depicts a side cross-sectional view of a heating element of the submerged heater of FIG. 4A.
Figure 4D:
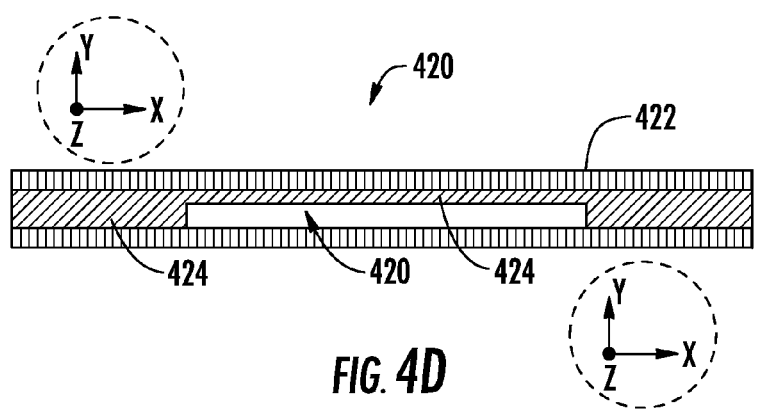
FIG. 4D depicts an end cross-sectional view of a variant of a submerged heater showing details of a heating element.

FIG. 4C depicts a side cross-sectional view of the submerged heater 400 at the plane A-A shown in FIG. 4B. In operation, current is passed through the inner structure 402 and heating element 410, causing resistive heating within the heating element 410. The relative ratio of cross-sectional area $C_1$ of the inner structure 402 to cross-sectional area $C_2$ of heating element 410 may be arranged such that the heating element 410 generates a temperature of 1800 K or more without excessive heating of the inner structure 402. Accordingly, heating generated by the submerged heater 400 may be concentrated in regions immediately adjacent the heater portion 408. In some embodiments the diameter $D_1$ of the heater portion 408 may be less than 5 mm, and in one example may be 3 mm. In one example the diameter $D_2$ of the heating element 410 may be 1 mm, such that the thickness of the shell 412 may also be 1 mm. In examples in which the shell 412 is composed of fused silica, this thickness allows heat to be transmitted through the shell 412 without excessive temperature drop as discussed above. In one example, the dimension $D_3$ as shown in FIG. 4B of the shell 404 of the holder 406 is 5 mm and the dimension $D_4$ of the inner structure 402 is 3 mm. However the embodiments are not limited in this context. FIG. 4D depicts an end cross-sectional view of another embodiment of a heater portion 420. In this embodiment, the heater portion includes a shell 422 that encases a heating element 424 which has a thinned section 426 in a middle region. Because of the smaller cross-sectional area of the thinned section 426, heating may be concentrated within the thinned section 426.

Figure 5:
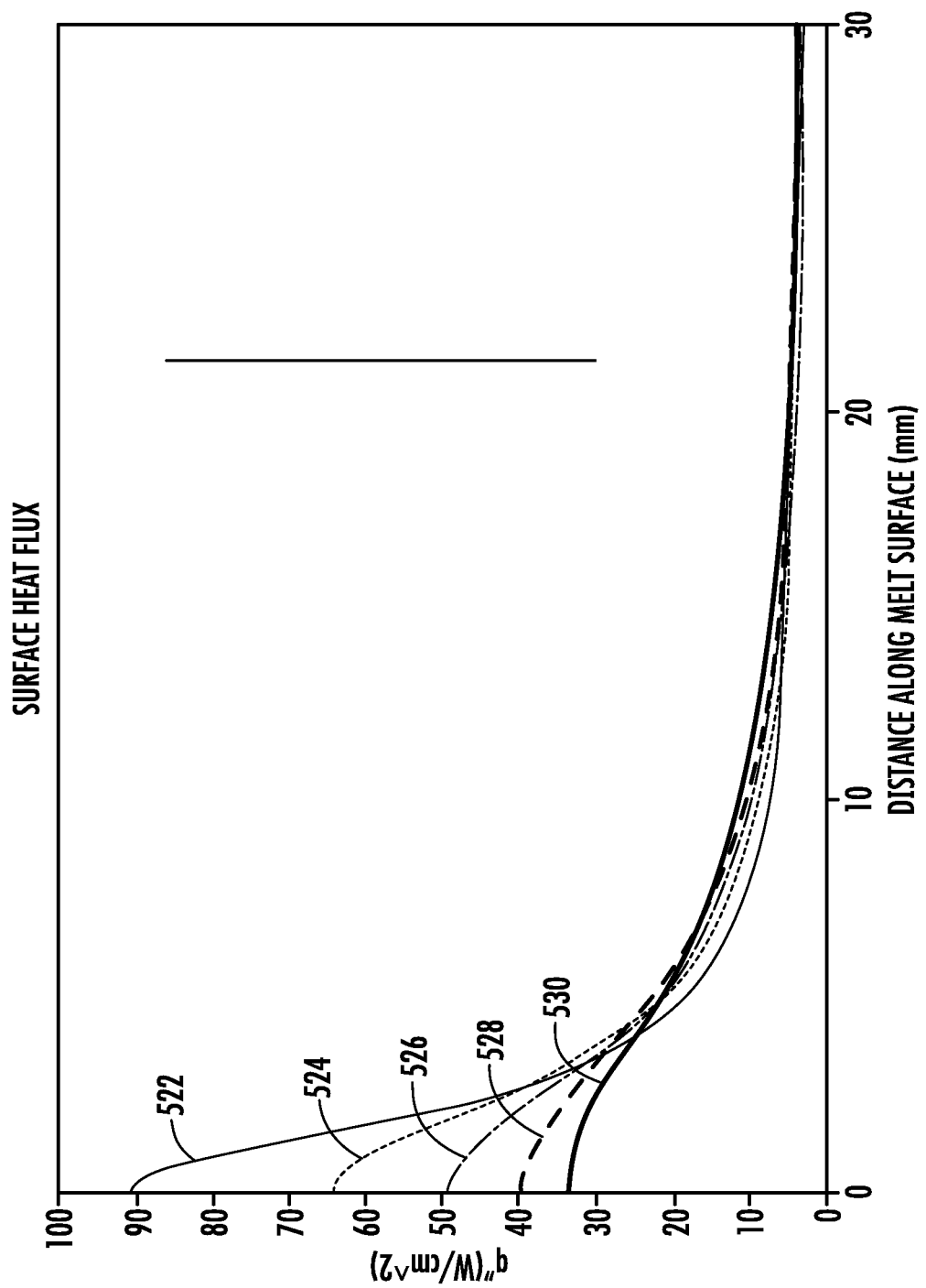
FIG. 5 presents a graphical depiction of heat flow profiles as a function of submerged depth of a heating element consistent with various embodiments.

In various embodiments, a submerged heater may be arranged to provide a heat flow in excess of 30 W/cm² at an exposed surface of a melt. FIG. 5 depicts the results of CFD calculations of heat flux to an exposed surface as a function of submerged heater position with respect to exposed surface of a melt. The curve 530, as well as curves 522-528, is a heat flow profile showing heat flow (flux) at the exposed surface of a melt as a function of position along a direction parallel to the surface of a melt. The curve 530 represents heat flow when a submerged heater is located 5 mm below the exposed surface. The position X=0 represents a position directly above the center of the submerged heater. Thus, a symmetric heat flow curve to the left of X=0 that is a mirror image of the curve 530 is implied. As shown, a maximum heat flow of 33 W/cm² is generated at X=0, which heat flow decreases below 20 W/cm² at X=6 mm. The curve 528 represents heat flow when the submerged heater is located 4 mm below the exposed surface. As shown, a maximum heat flow of 40 W/cm² is generated at X=0. As the depth below the exposed surface of the submerged heater decreases the peak value of heat flow increases, as exhibited by curve 526 (3 mm), curve 524 (2 mm) and curve 522 (1 mm). In the case of 1 mm depth a peak heat flow of 90 W/cm² is achieved. In addition, the value of peak full width at half maximum (FWHM) decreases from greater than 7 mm for a depth of 5 mm to an FWHM value of 5 mm for a depth of 1 mm.

Figure 6A:
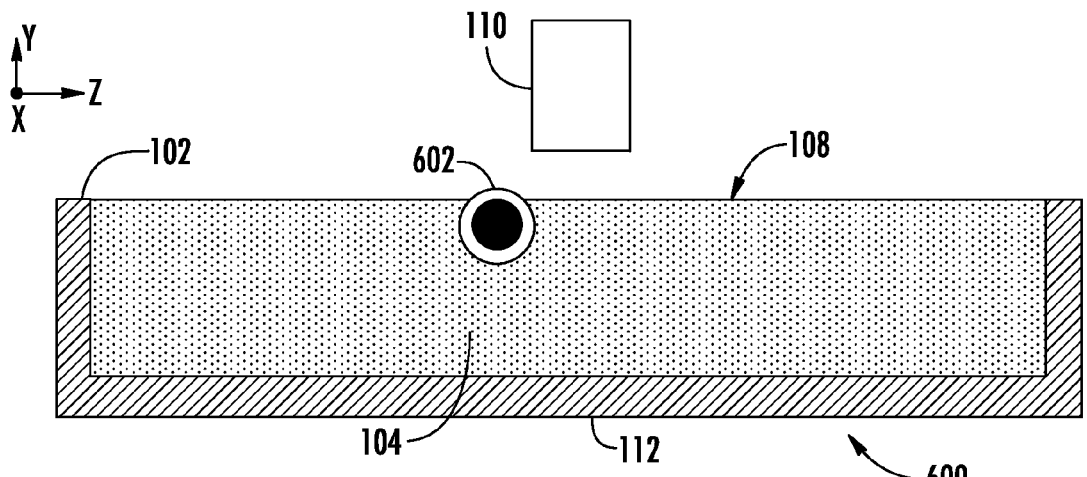
FIG. 6A presents an embodiment of another processing apparatus consistent with an additional embodiment.
Figure 6B:
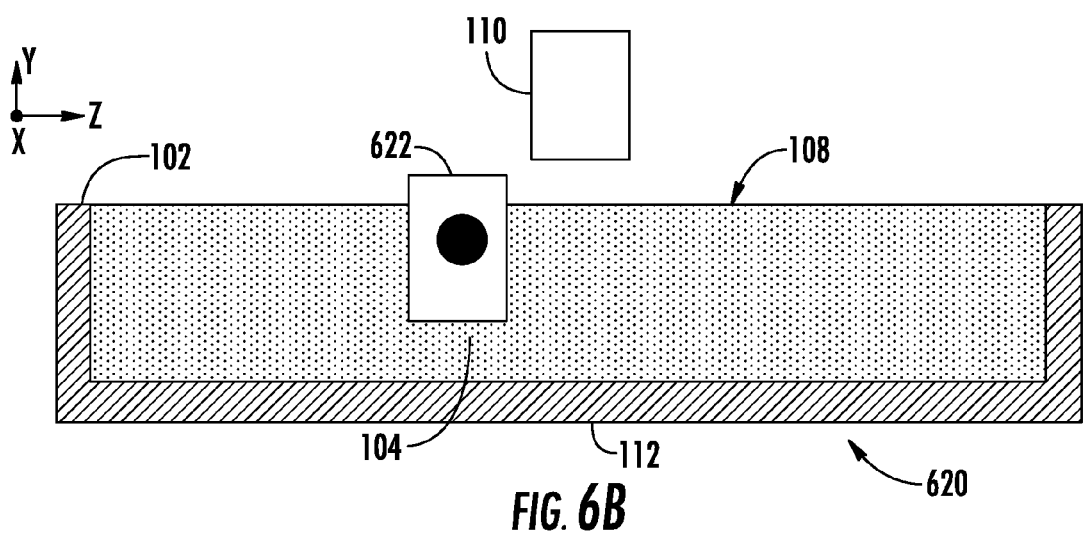
FIG. 6B presents a further embodiment of a processing apparatus consistent with an additional embodiment.
Figure 6C:
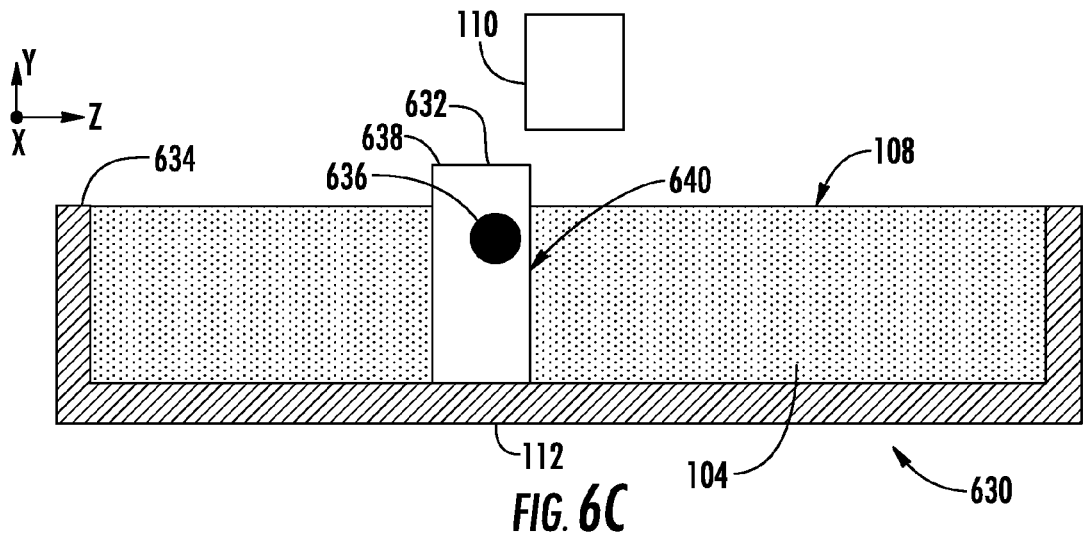
FIG. 6C presents still another embodiment of a processing apparatus consistent with an additional embodiment.

Although the aforementioned embodiments depict apparatus in which a heater portion of a submerged heater is entirely surrounded by a melt, in other embodiments a part of the heater portion may extend above the exposed surface of a melt. FIG. 6A depicts a further embodiment of a processing apparatus 600 in which a submerged heater 602 is just partially submerged below the exposed surface 108, so that at least a part of the heater portion lies above the exposed surface 108. Notably, for clarity no holder portion of the submerged heater 602 is shown, and just the heater portion is visible, which may have a cylindrical shape as discussed above with respect to FIG. 3 and FIGS. 4A-4D. FIG. 6B depicts a further embodiment of a processing apparatus 620 in which a submerged heater 622 that has a rectangular cross section is just partially submerged below the exposed surface 108. In the embodiments of FIG. 6A and FIG. 6B a submerged heater may be composed of a heating element and fused silica shell as discussed for the previously disclosed embodiments. FIG. 6C depicts a further embodiment of a processing apparatus 630 in which the submerged heater 632 is affixed to the crucible 634. In one example the submerged heater 632 has a heating element 636 that is offset within a shell 638, which may be composed of fused silica. The heating element 636 is offset so as to be nearer to surface 640 that is closer to the crystallizer 110. Accordingly, heat flow from the submerged heater 632 may be much larger to the right of the submerged heater 632 than to the left in the view of FIG. 6C. This may allow heat flow to be concentrated in a region under the crystallizer where a leading edge of a crystalline sheet may form as discussed above. For example, surface heat flow may be sharply peaked at positions just to the right of the surface 640. This type of peaked heat flow profile may be useful when it is desired to confine high heat flow to a narrow process zone adjacent a leading edge of a crystalline sheet.

An advantage of the embodiments of FIGS. 6A, 6B and 6C is that the respective submerged heaters may be affixed at a single position, and may therefore not involve the use of any actuator or complex holder that are used to provide movement of a submerged heater at different positions with respect to the exposed surface 108 and the crystallizer 110. The operation submerged heaters of the embodiments of FIG. 6A to 6C also do not involve any procedure to ensure that their upper surfaces are wet by a silicon melt, as discussed below with respect to FIGS. 9A and 9B.

Figure 7A:
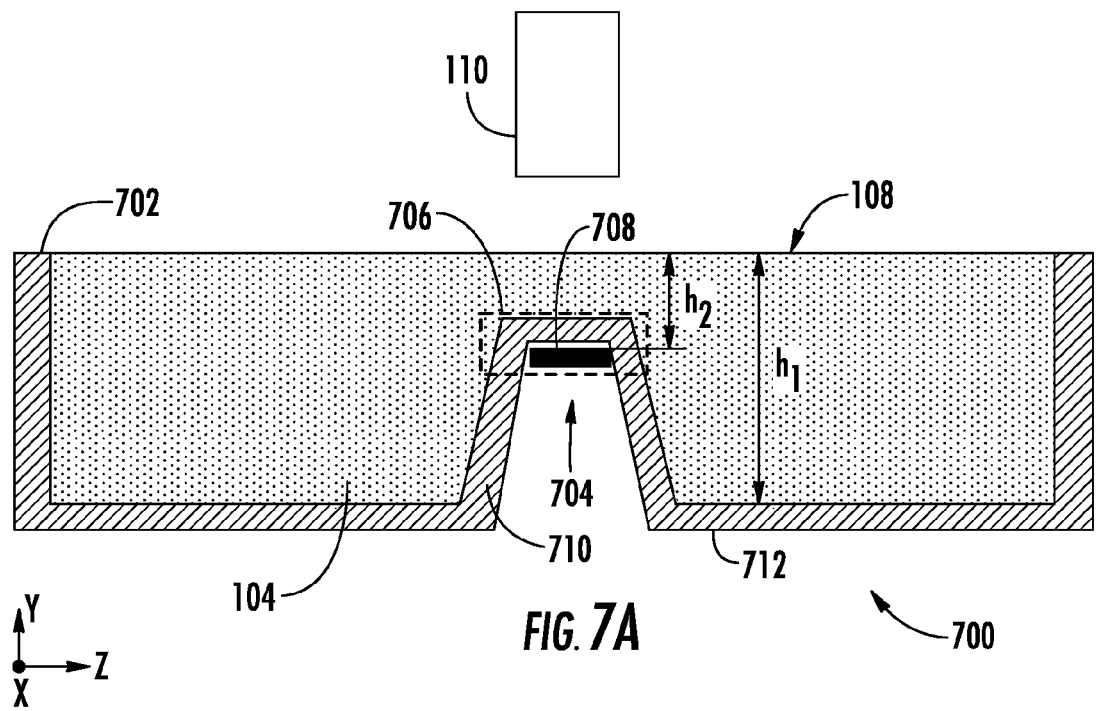
FIG. 7A depicts an additional processing apparatus consistent with a further embodiment.

FIG. 7A depicts another embodiment in which a processing apparatus 700 includes a submerged heater 704 that is formed integrally with a crucible 702 of the processing apparatus 700. The submerged heater 704 is composed of an upper region 706 that forms a part of the crucible wall 710 of crucible 702. The crucible wall 710 is indented as shown so that the upper region 706 is closer to the exposed surface 108 than is the lower region 712 of the crucible. This allows a heating element 708 of the submerged heater 704 to be placed adjacent to, or in contact with the upper region 706 in a manner that the heating element 708 lies on the side of the crucible that is not in contact with the melt 104. The portion of the crucible wall 710 that lies in the upper region 706 of the submerged heater thus acts as a shell that protects the heating element. In this manner, the top of the heating element 708 may be safely located at a distance $h_2$ separating the heating element 708 from the exposed surface 108 that is much less than the distance $h_1$ between the exposed surface and lower region 712 of the crucible 702.

Figure 7B:
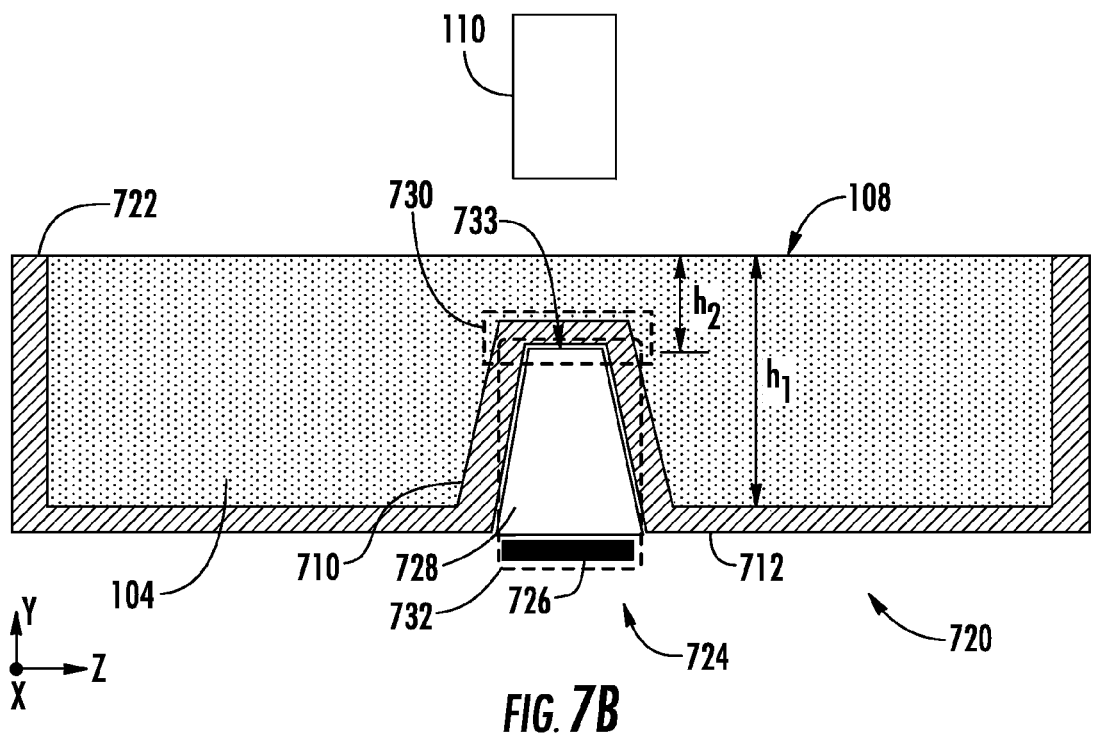
FIG. 7B depicts yet another processing apparatus consistent with a further embodiment.

FIG. 7B depicts a further embodiment in which a processing apparatus 720 includes a submerged heater 724 that also has an upper region 730 that forms a part of the crucible wall 710 of crucible 722. However, in this embodiment a heating element 732 is composed of two parts, an active heater component 726 and a conductor portion 728. The active heater component 726 is located at or below the lower region 712 of the crucible 702 and is configured to generate heat that is conducted through the conductor portion 728 into the melt 104. The conductor portion 728 may be a highly thermally conductive material such as graphite. This allows the upper region of the conductor portion 728 to attain a temperature similar to or the same as the active heater component 726. From the perspective of the melt 104 the upper region 730 of heating element 732 appears as a heat source whose upper surface is disposed at a distance $h_2$ that separates the top 733 of the heating element 732 from the exposed surface 108. An advantage of this embodiment is that the heat source that is created by the heating element 732 may be located close to the exposed surface 108 without having to place an active heater component 726 within the upper region 730.

Figure 8A:
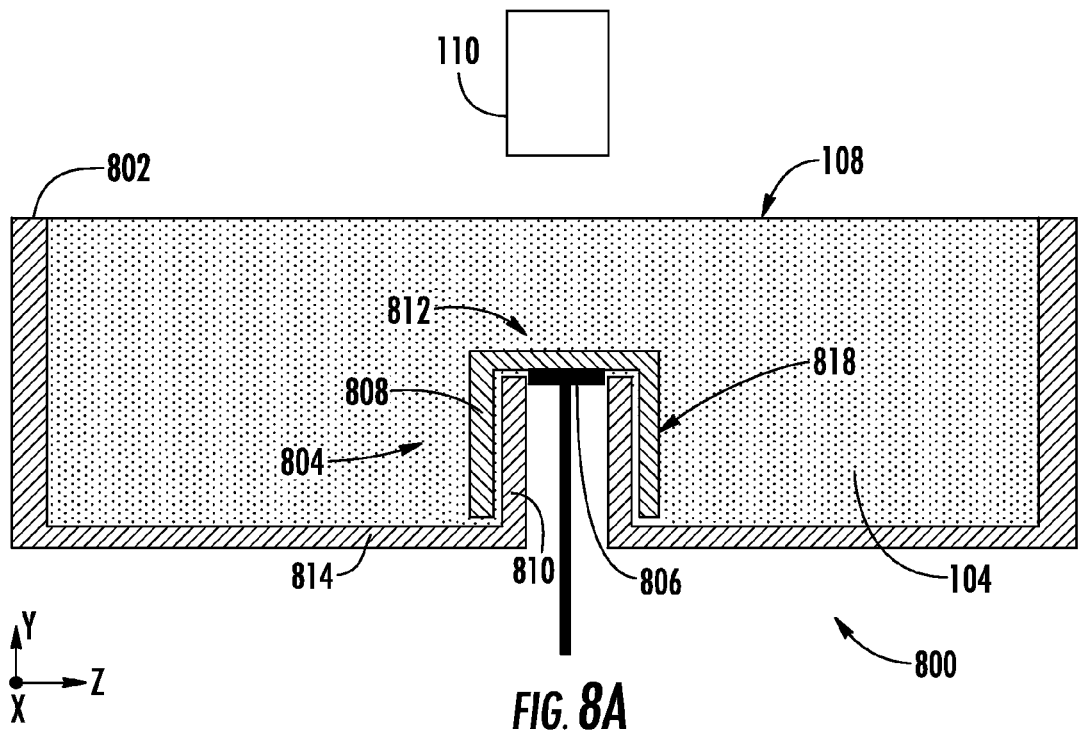
FIG. 8A depicts another embodiment of a processing apparatus.

In other embodiments a movable submerged heater may include a stationary portion formed from the crucible wall of a crucible and a movable portion that includes a heating element. FIG. 8A depicts a side cross-sectional view of one embodiment of a processing apparatus 800 that includes a movable submerged heater, shown as submerged heater 804. The submerged heater 804 includes a movable cap structure that includes a movable portion 812 and fixed portion 810. The fixed portion 810 may form part of the crucible wall 814 of crucible 802. The walls of the fixed portion 810 extend at an angle, such as 90 degrees with respect to the exposed surface 108. The fixed portion 810 is arranged to accommodate the movable portion 812 so that the movable portion 812 is slidable at least along the Y-axis with respect to the fixed portion 810. As further shown in FIG. 8A, the movable portion 812 may include an inert part 808 that is composed of fused silica and a heating element 806. The heating element 806 may be affixed to the inert part 808 so that heat is efficiently transferred from the heating element 806 into the melt 104.

Figure 8B:
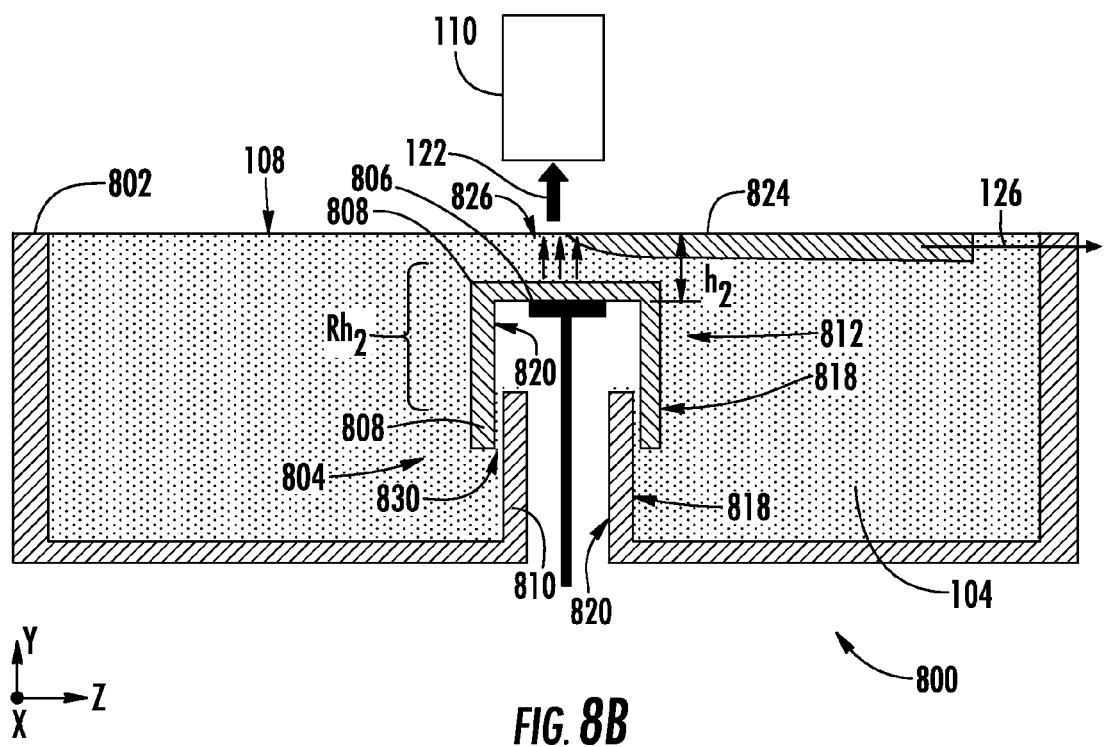
FIG. 8B depicts one example of operation of the embodiment of FIG. 8A.

FIG. 8B illustrates one instance of operation of the processing apparatus 800. In this example, the movable portion 812 is disposed closer to the exposed surface 108 than in the scenario of FIG. 8A. In various embodiments, the movable portion 812 may be configured to change the distance $h_2$ that separates the top of the heating element 806 from the exposed surface 108. For example, the movable portion 812 may be configured to provide a range of $h_2$ ($Rh_2$) between 5 mm and 1 mm in some cases. In the example of FIG. 8B the movable portion 812 may be placed at a distance $h_2$ wherein the heating element is capable of delivering a heat flow 826 that is at least 50 W/cm². When cooling is delivered to the exposed surface 108 that is sufficient to crystallize material at the exposed surface 108, this heat flow rate of heat flow 826 into the exposed surface 108 may be used to generate a crystalline sheet 824 having improved properties due to the high rate of heat flow provided to the leading edge (see FIG. 1C) of the crystalline sheet 824, as well as the rapid rate of cooling from the exposed surface 108.

As also illustrated in FIGS. 8A and 8B the submerged heater 804 is configured so that a contact surface 818 of the submerged heater that is in contact with the melt 104 may be entirely composed of an inert material such as fused silica. For example, as the movable portion 812 is moved upwardly with respect to fixed portion 810, the walls of the fixed portion 810, which are not exposed in FIG. 8A, may be exposed to the melt 104. However, because the walls of the fixed portion 810 form part of the crucible, the walls may also be composed of fused silica. Although a gap may exist between the fixed portion 810 and movable portion 812 to accommodate movement of the movable portion 812, the melt material of melt 104 may not penetrate the gap 830 because of the difference in surface energy of molten silicon and fused silica. This difference in surface energy causes a high contact angle to form between molten silicon and fused silica. Accordingly, a gap 830 of several tenths of a millimeter may be provided in the submerged heater 804 without melt 104 penetrating to the outer surface 820 of the submerged heater 804. In this manner the heating element 806, which may be affixed to the outer surface 820, remains protected even when the movable portion 812 is extended upwardly.

Figure 9A:
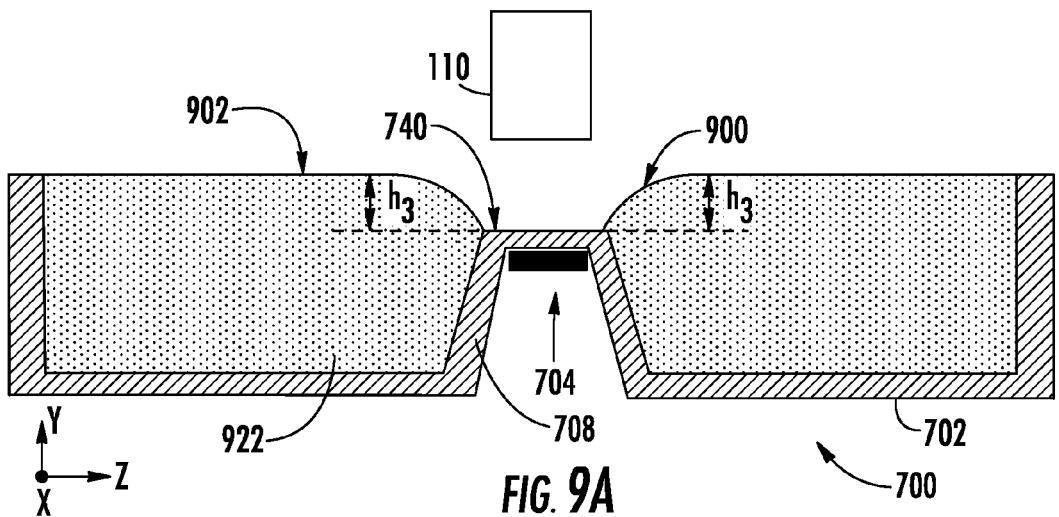
FIGS. 9A-9C depict various operations involved in an exemplary process according to one embodiment.
Figure 9B:
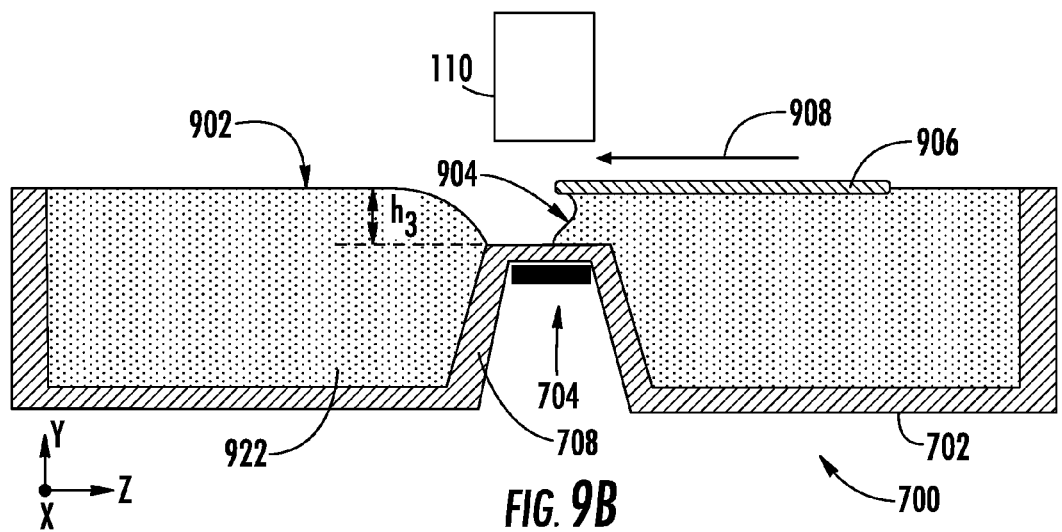
Figure 9C:
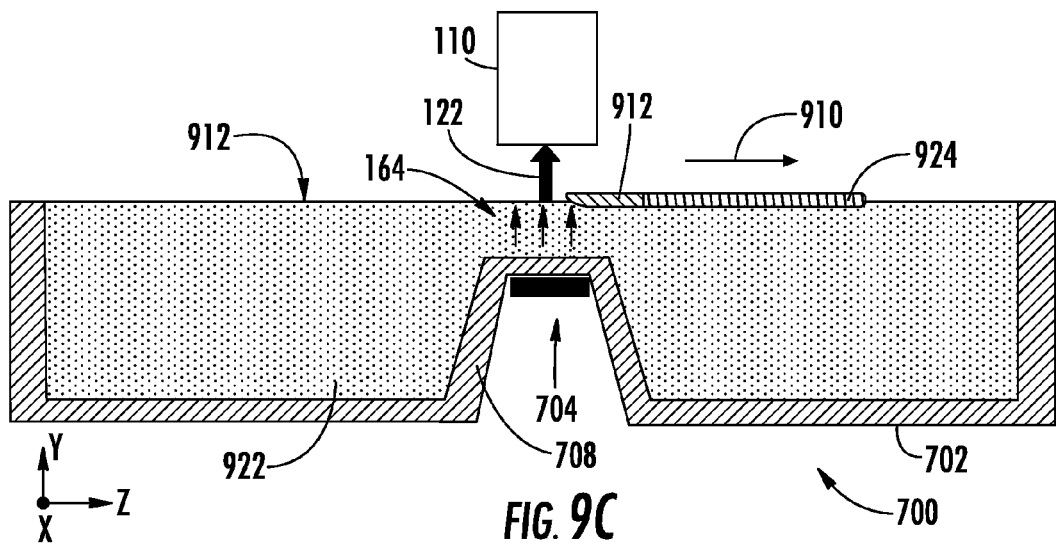

Because of the aforementioned difference in surface energy of molten silicon and fused silica, in various embodiments a submerged heater that has a shell composed of fused silica may be placed sufficiently close to an exposed surface of a silicon melt so as to disrupt that surface due to de-wetting of the submerged heater by the silicon melt. In view of this, in some embodiments, a processing apparatus may undertake a series of operations before initiating horizontal growth of a crystalline sheet of silicon. FIG. 9A depicts an initial stage of operation of the processing apparatus 700 before crystalline sheet growth. In the instance shown in FIG. 9A, a melt 922 is formed in the crucible 702. The melt 922 may be a silicon melt that is formed when silicon is introduced into the crucible 702 and heat is provided by external heaters (not shown) such as the heater 152A and heater 152B depicted in FIG. 1D. In some implementations the distance $h_3$ from the top of the submerged heater 704 to the horizontal portions of the exposed surface 900 or exposed surface 902 may be as small as 1 mm or less. Because of this the melt 922 may de-wet the surface 740, which may be composed of fused silica, thus forming the curved shape of the exposed surface 902 and exposed surface 900 as illustrated. Although the de-wetting scenario of FIG. 9A is depicted for the submerged heater 704, a similar de-wetting of a submerged heater top surface may take place when the top surface of any of the aforementioned submerged heaters is located close to an exposed surface of a melt. In order to rewet the top surface of a submerged heater such as submerged heater 704, a silicon solid piece may be drawn over the top region of the melt 922. FIG. 9B depicts a subsequent stage in which a silicon piece 906 is drawn over the submerged heater 704 from the right side of the submerged heater 704 toward the left along the direction 908 that lies parallel to the Z-axis in the view of FIG. 9B. The melt 922 wets the underside of the silicon piece 906, forming the surface 904, and is thus drawn to the left in concert with the silicon piece 906 until the melt 922 entirely covers the submerged heater 704. Subsequently, in the stage shown in FIG. 9C, a silicon seed 924 may be drawn back along the direction 910 that is opposite to the direction 908 and a crystalline sheet 912 may be drawn when surface heat flow 164 is supplied by submerged heater 704 and cooling supplied by crystallizer 110 as described above.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An apparatus for processing a melt, comprising:
a crucible configured to contain the melt, the melt having an exposed surface that is separated from a floor of the crucible by a first distance;
a crucible heater disposed below the floor of the crucible and configured to deliver a heat flow to maintain the melt at or above a melting temperature of the melt; and
a submerged heater comprising a heating element and a shell disposed between the heating element and the melt, wherein the heating element does not contact the melt,
the heating element being disposed at a second distance with respect to the exposed surface of the melt that is less than the first distance, wherein the submerged heater is disposed above the crucible heater.

2. The apparatus of claim 1, wherein the heating element comprises graphite that is coated with silicon carbide and the shell comprises fused silica.

3. The apparatus of claim 2, wherein the heating element is surrounded by the melt.

4. The apparatus of claim 1, wherein the melt is composed of silicon and the shell comprises fused silica.

5. The apparatus of claim 1, wherein the submerged heater is configured to deliver a heat flow of greater than 50 W/cm$^2$ to the exposed surface.

6. The apparatus of claim 1, wherein the submerged heater is elongated along a first direction parallel to the exposed surface.

7. The apparatus of claim 6, wherein the heater has a heater width along the first direction of at least 15 cm.

8. The apparatus of claim 1, further comprising a drive configured to move the submerged heater along a vertical direction that is perpendicular to the exposed surface.

9. The apparatus of claim 8, wherein the submerged heater comprises a movable cap structure comprising:
a movable portion having a contact surface in contact with the melt and an outer surface that is in contact with the heating element; and
a fixed portion that forms part of a crucible wall of the crucible.

10. The apparatus of claim 1, wherein the submerged heater comprises an upper region that forms a portion of a crucible wall of the crucible and is disposed closer to the exposed surface of the melt than the floor of the crucible, and wherein the heating element is disposed outside of the crucible wall.

11. A system for controlling heat flow within a melt, comprising:
a crucible configured to contain the melt, the melt having an exposed surface that is separated from a floor of the crucible by a first distance;
a submerged heater configured to contact the melt, the submerged heater comprising a heating element and a shell that is disposed between the heating element and the melt, wherein the melt does not contact the heating element,
the heating element being disposed at a second distance with respect to the melt that is less than the first distance, wherein the submerged heater is configured to deliver heat to a region of the exposed surface at a first heat flow rate;
a crucible heater disposed below the floor of the crucible and configured to deliver a third heat flow to maintain the melt at or above a melting temperature of the melt, wherein the submerged heater is disposed above the crucible heater; and
a crystallizer configured to remove heat from the region of the exposed surface at a second heat flow rate greater than the first heat flow rate.

12. The system of claim 11, wherein the submerged heater comprises a graphite heating element that is encased by a fused silica shell.

13. The system of claim 11, further comprising a crucible heater disposed below the floor of the crucible and configured to deliver a third heat flow to maintain the melt at or above a melting temperature of the melt.

14. The system of claim 11, wherein the melt is composed of silicon and the shell portion is composed of fused silica.

15. The system of claim 11, wherein the submerged heater is configured to deliver a heat flow of greater than 50 W/cm$^2$ to the exposed surface.

16. The system of claim 11, wherein the crystallizer is configured to form a leading edge of a crystalline sheet along a first direction, and wherein the submerged heater is elongated along the first direction.

17. The system of claim 11, further comprising a drive configured to move the submerged heater along a vertical direction that is perpendicular to the exposed surface.

18. A method to process a melt comprising
arranging the melt in a crucible; the melt having an exposed surface and lower surface that is in contact with a floor of the crucible, the exposed surface being separated from the lower surface by a first distance;
directing a first heat flow from a crucible heater disposed below the crucible to the exposed surface; and
directing a heat flow from a heating element of a submerged heater into a region of the exposed surface of the melt when the heating element is disposed at a second distance from the exposed surface that is less than the first distance,
wherein the melt does not contact the heating element, and wherein the submerged heater is disposed above the crucible heater.

19. The method of claim 18, wherein the submerged heater comprises a fused silica shell that surrounds the heating element and contacts the melt, wherein the melt is silicon, the method further comprising:
directing the heat flow to into the region of the exposed surface at a first heat flow rate;
and removing heat from the region of the exposed surface at a second heat flow rate greater than the first heat flow rate.

* * * * *